United States Patent
Post et al.

(10) Patent No.: US 8,356,137 B2
(45) Date of Patent: Jan. 15, 2013

(54) DATA STORAGE SCHEME FOR NON-VOLATILE MEMORIES BASED ON DATA PRIORITY

(75) Inventors: Daniel J. Post, Campbell, CA (US); Matthew Byom, Campbell, CA (US); Vadim Khmelnitsky, Foster City, CA (US); Nir J. Wakrat, Los Altos, CA (US); Kenneth Herman, San Jose, CA (US)

(73) Assignee: Apple Inc., Cupertino, CA (US)

(*) Notice: Subject to any disclaimer, the term of this patent is extended or adjusted under 35 U.S.C. 154(b) by 356 days.

(21) Appl. No.: 12/713,529

(22) Filed: Feb. 26, 2010

(65) Prior Publication Data
US 2011/0213945 A1    Sep. 1, 2011

(51) Int. Cl.
*G06F 12/06* (2006.01)
*G11C 20/00* (2006.01)

(52) U.S. Cl. ........ 711/103; 711/158; 714/763; 714/768; 714/773

(58) Field of Classification Search .................. 711/103; 714/758, 673, 768, 774, 779
See application file for complete search history.

(56) References Cited

U.S. PATENT DOCUMENTS

| | | | |
|---|---|---|---|
| 7,739,576 B2* | 6/2010 | Radke | 714/758 |
| 2005/0041669 A1* | 2/2005 | Cansever et al. | 370/395.21 |
| 2007/0033496 A1* | 2/2007 | Cooklev et al. | 714/776 |
| 2008/0072120 A1* | 3/2008 | Radke | 714/768 |
| 2009/0024904 A1* | 1/2009 | Roohparvar et al. | 714/773 |
| 2009/0027796 A1* | 1/2009 | Nitta | 360/31 |
| 2010/0058125 A1* | 3/2010 | Chen et al. | 714/704 |
| 2011/0035634 A1* | 2/2011 | Blaum et al. | 714/704 |
| 2011/0185265 A1* | 7/2011 | Cherukuri | 714/782 |
| 2011/0209028 A1* | 8/2011 | Post et al. | 714/758 |
| 2011/0320915 A1* | 12/2011 | Khan | 714/773 |

* cited by examiner

*Primary Examiner* — John Lane
(74) *Attorney, Agent, or Firm* — Kramer Levin Naftalis & Frankel LLP

(57) ABSTRACT

Systems and methods are disclosed for partitioning data for storage in a non-volatile memory ("NVM"), such as flash memory. In some embodiments, a priority may be assigned to data being stored, and the data may be logically partitioned based on the priority. For example, a file system may identify a logical address within a first predetermined range for higher priority data and within a second predetermined range for lower priority data, such using a union file system. Using the logical address, a NVM driver can determine the priority of data being stored and can process (e.g., encode) the data based on the priority. The NVM driver can store an identifier in the NVM along with the data, and the identifier can indicate the processing techniques used on the associated data.

15 Claims, 8 Drawing Sheets

MY PLAYLIST

| | | | |
|---|---|---|---|
| SONG A<br>ALBUM A – ARTIST A | MY RATING:<br>★★★★★ | PRIORITY:<br>HIGH | 306 |
| SONG B<br>ALBUM B – ARTIST B | MY RATING:<br>★☆☆☆☆ | PRIORITY:<br>STNRD | 308 |
| SONG C<br>ALBUM C – ARTIST C | MY RATING:<br>★★★☆☆ | PRIORITY:<br>STNRD | |
| SONG D<br>ALBUM D – ARTIST D | MY RATING:<br>★★★★★ | PRIORITY:<br>HIGH | |
| SONG E<br>ALBUM E – ARTIST E | MY RATING:<br>☆☆☆☆☆ | PRIORITY:<br>STNRD | |
| SONG F<br>ALBUM F – ARTIST F | MY RATING:<br>★★★★☆ | PRIORITY:<br>HIGH | |
| SONG G<br>ALBUM G – ARTIST G | MY RATING:<br>☆☆☆☆☆ | PRIORITY:<br>STNRD | |
| SONG H<br>ALBUM H – ARTIST H | MY RATING:<br>☆☆☆☆☆ | PRIORITY:<br>STNRD | |

DATA STORAGE SCHEME FOR NON-VOLATILE MEMORIES BASED ON DATA PRIORITY

FIELD OF THE INVENTION

This can relate to partitioning data for storage in a non-volatile memory, such as a flash memory.

BACKGROUND OF THE DISCLOSURE

NAND flash memory, as well as other types of non-volatile memories ("NVMs"), are commonly used for mass storage. For example, consumer electronics such as portable media players or cellular telephones often include raw flash memory or a flash card to store music, videos, and other media.

Some non-volatile memories, such as NAND flash memory, may have memory locations that include initial defects or can develop defects through use. Also, memory locations may suffer from other error-causing phenomena, such as read disturb or charge retention issues. Thus, to ensure that data stored in these memory locations can be accurately retrieved, redundant information be computed and stored along with the data. For example, an error correcting code may be applied to the data prior its storage in the non-volatile memory.

An error correcting code may be measured by its "strength." The strength, t, may indicate the number of errors (e.g., bit flips) that may be tolerated. Any additional errors may result in mis-corrections. A higher-strength error correcting code typically requires more redundant information for the same amount of data than a lower-strength error correcting code. Therefore, there is a tradeoff between the number of errors that can be corrected and the amount of space sacrificed in the non-volatile memory for storing redundant information.

SUMMARY OF THE DISCLOSURE

Systems and methods are disclosed for partitioning data for storage in a non-volatile memory, such as flash memory (e.g., NAND flash memory).

In some embodiments, an electronic system may be provided which can include a host, such as a portable media player or a cellular telephone, and a non-volatile memory ("NVM") of any suitable type. For example, the non-volatile memory can include flash memory, such as one or more flash dies. Optionally, the NVM may be packaged with a NVM controller, and therefore the NVM may or may not be a managed NVM. The host may include a host processor for controlling and managing the memory locations of the NVM and the data stored therein.

In some embodiments, the host (e.g., via the processor) or the NVM controller may partition data based on a priority assigned to the data. For example, the host or NVM controller may assign the data a high priority based on a user indication that the data is important to the user, by default, or because the data is not easily recoverable (i.e., user-generated or user-personalized data, data that is not backed up in another storage medium, etc.). The host or NVM controller may assign data a lower, "standard" priority otherwise, such as if the data has been backed up to another storage medium and is therefore more easily recoverable.

In some embodiments, the priority may be assigned by an application running on the host processor. For example, the application may interface with the user and receive direct or indirect indications of how important data is to the user. To store the data, the application may provide a file system with the data, and, optionally, the application may also provide the file system with the priority of the data. The file system can identify a logical address in which to store the data. The file system may identify a logical address within a first predetermined range (e.g., between address 0 and address X for a suitable value of X) when the data has been assigned a high priority and within a second predetermined range (e.g., between address X+1 and the address with the highest possible logical address) when the data has been assigned a standard priority. The address space formed by the first predetermined range may be referred to as a "high priority partition" and the address space formed by the second predetermined range may be referred to as a "standard priority partition."

In some embodiments, the file system may be a union file system. The union file system may include a first file system (e.g., a read/write file system) and a second file system (e.g., a read only file system). The first file system can be responsible for storing high priority data and the second file system can be responsible for storing standard priority data.

Thus, in some embodiments, a union file system can initially default to storing data in the high priority partition. The union file system can use its read/write file system to identify a logical address at which to store the data. At some time, the data may be backed up to another storage medium, such as to a computer system during a synchronization or a backup operation. Responsive thereto, the data may be reassigned to a standard priority and the union file system may use the read only file system to identify a new logical address in the standard priority partition for the data. In some embodiments, instead of immediately providing the data to the read only file system, the union file system can mark the data as data that needs to be moved to the standard priority partition. Then, when the high priority partition runs out or is low on space, the data may be provided to the standard priority partition.

In some embodiments, the host processor can execute a non-volatile memory driver configured to store (or direct an NVM controller to store) the data in a non-volatile memory based on the priority of the data. The memory driver or NVM controller may assign a priority to the data and/or determine the priority of the data based on the logical address. For example, the memory driver or NVM controller can determine whether the logical address is within the first or second predetermined range, and may operate based on the determination. In some embodiments, the memory driver or NVM controller may encode the data based on the priority, such as by applying a higher-strength error correcting code for high priority data and a lower-strength error correcting code for standard priority data. This way, data that has a high priority may be more resilient to any errors that may occur while the encoded data is stored in memory cells of the non-volatile memory.

To differentiate between memory cells storing data encoded using different error correcting codes, the memory driver or NVM controller may reserve a portion of a block to store an indicator. For example, the memory driver or NVM controller may use the first page or set of pages in a block to store an indicator that specifies the priority of the data stored in the remaining portions of the block. The indicator therefore indicates which error correction code was applied to the data. This way, when the data is read back out of the block, the memory driver or NVM controller may be able to determine how to decode the stored encoded data.

Thus, using the disclosed features and embodiments, the electronic system can selectively increase the protection afforded to the storage of certain data that the electronic system determines is higher priority. The types of data afforded this increased protection may be selected to be any suitable proportion of total data stored. Because increased protection may increase use of storage space, there may be a tradeoff between storage capacity and the proportion of data afforded increased protection. In some embodiments, the electronic system may assign as high priority a larger proportion of total data, such as all data except for files backed up (i.e., synchronized) with another of the user's electronic systems (e.g., desktop or laptop computer) or other data that is easily recoverable. In other embodiments, the electronic system may assign as high priority a smaller proportion of total data, such as only user-generated data (e.g., game state, draft e-mails, user-capture videos or pictures).

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which:

FIG. 3A is a display screen of an illustrative music playlist that may be provided by an electronic system configured in accordance with various embodiments of the invention;

DETAILED DESCRIPTION OF THE DISCLOSURE

Figure 1:
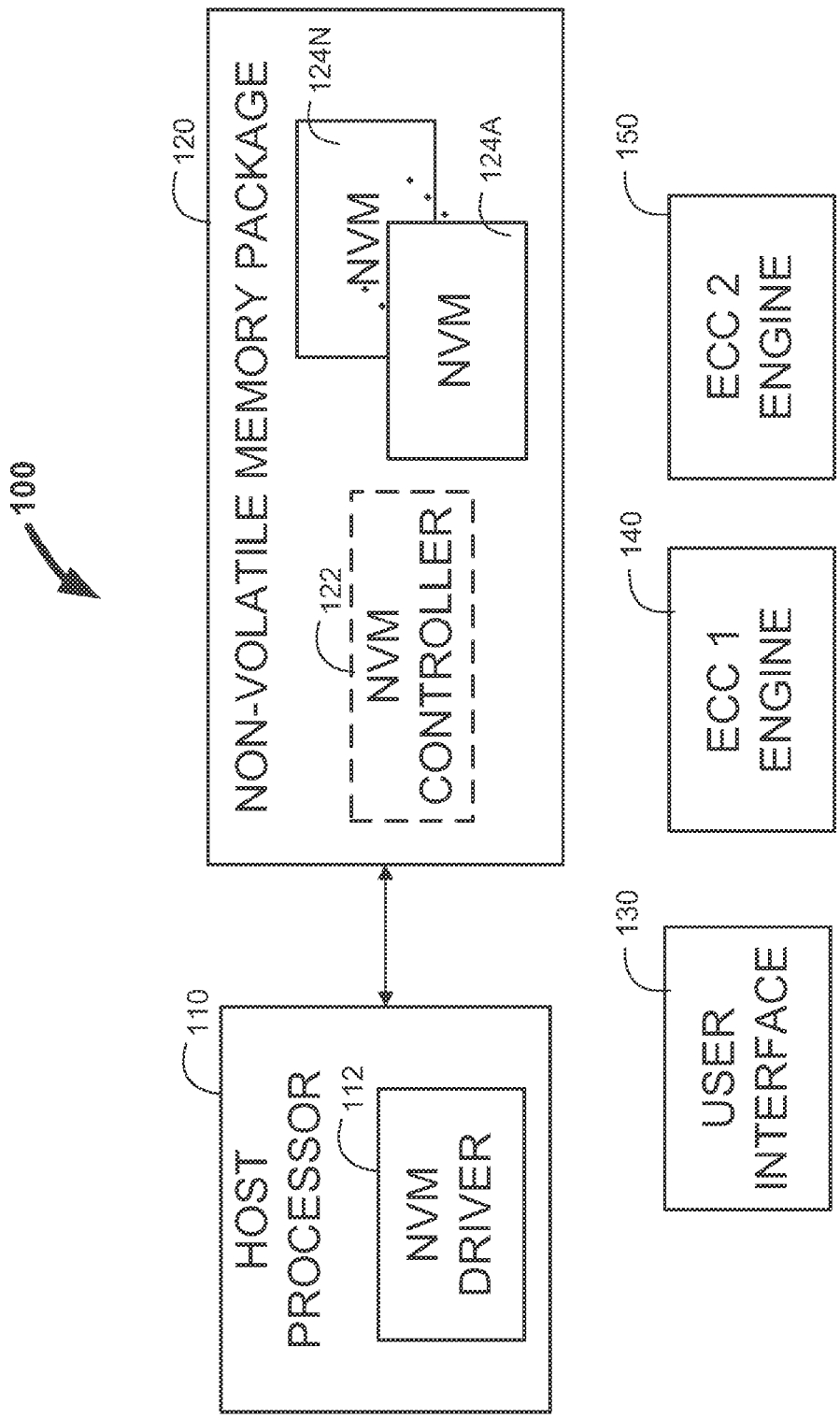
FIG. 1 is a schematic view of an illustrative memory system including a host processor and a non-volatile memory package configured in accordance with various embodiments of the invention.

FIG. 1 is a schematic view of memory system 100. Memory system 100 can include host processor 110, at least one non-volatile memory ("NVM") package 120, user interface 130, and error correction code ("ECC") engines 140 and 150. Host processor 110, user interface 130, and optionally NVM package 120 and ECC engines 140 and 150 can be implemented in any suitable host device or system, such as a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, or a laptop computer. For simplicity, the host device or system, which may include host processor 110, may sometimes be referred to simplicity as a "host."

Host processor 110 can include one or more processors or microprocessors that are currently available or will be developed in the future. Alternatively or in addition, host processor 110 can include or operate in conjunction with any other components or circuitry capable of controlling various operations of memory system 100 (e.g., application-specific integrated circuits ("ASICs")). In a processor-based implementation, host processor 110 can execute various programs loaded into a memory (not shown) implemented on the host. The memory can include any suitable type of volatile memory (e.g., cache memory or random access memory ("RAM"), such as double data rate ("DDR") RAM or static RAM ("SRAM")). Host processor 110 can execute NVM driver 112, which may provide vendor-specific and/or technology-specific instructions that enable host processor 110 to perform various memory management and access functions for non-volatile memory package 120.

NVM package 120 may be a ball grid array ("BGA") package or other suitable type of integrated circuit ("IC") package. NVM package 120 may be a managed NVM package or a raw NVM package. In a managed NVM implementation, NVM package 120 can include NVM controller 122 coupled to any suitable number of NVM dies 124A-124N. NVM controller 122 may include any suitable combination of processors, microprocessors, or hardware-based components (e.g., ASICs), and may include the same components as or different components from host processor 110. NVM controller 122 may share the responsibility of managing and/or accessing the physical locations of NVM dies 124A-124N with NVM driver 112. Alternatively, NVM controller 122 may perform substantially all of the management and access functions for NVM dies 124A-124N. Thus, a "managed NVM" may refer to a memory device or package that includes a controller (e.g., NVM controller 122) configured to perform at least one memory management function for a non-volatile memory (e.g., NVM dies 124A-124N).

In a managed NVM implementation, host processor 110 can communicate with NVM controller 122 using any suitable communications protocol, such as a suitable standardized inter-processor protocol. For example, in some embodiments, NVM package 120 may be included in a memory card (e.g., flash card), and host processor 110 and NVM controller 122 may communicate using Multimedia Memory Card ("MMC") or Secure Digital ("SD") card interfaces. In other embodiments, NVM package 120 may be included in a Universal Serial Bus ("USB") memory drive, and host processor 110 and NVM controller 122 may communicate via a USB protocol.

In some embodiments, non-volatile memory package 120 may be a raw NVM package. In these embodiments, NVM package 120 may not include NVM controller 122, and NVM dies 124A-124N may be managed substantially completely by host processor 110 (e.g., via NVM driver 112). Thus, a "raw NVM" may refer to a memory device or package that may be managed entirely by a host controller or processor (e.g., host processor 110) implemented external to the NVM package. To indicate that an NVM controller 122 may not be included in NVM package 120 in some embodiments of the invention, NVM controller 122 is depicted in dotted lines.

NVM dies 124A-124N may be used to store information that needs to be retained when memory system 100 is powered down. As used herein, and depending on context, a "non-volatile memory" can refer to NVM dies or devices in which data can be stored or may refer to a NVM package that includes the NVM dies. NVM dies 124A-124N can include NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), any other known or future types of non-volatile memory technology, or any combination thereof. FIG. 1, as well as later figures and various disclosed embodiments, may sometimes be described in terms of using flash technology. However, this is merely illustrative and not intended to be limiting.

NVM dies 124A-124N can be organized into one or more "planes" which can concurrently carry out access operations to its memory locations (e.g., program, read, and erase operations). The memory locations of each plane may be organized into "blocks" that may each be erasable at once, with its blocks further organized into "pages" that may each be programmable and readable at once. The blocks from corresponding NVM dies 124A-124N (e.g., one block from each NVM die having the same position or block number) may form logical storage units referred to as "super blocks." NVM dies 124A-124N may include any suitable number of planes, blocks, and pages. For example, in some embodiments, each NVM die 124 may include two planes, where each plane can include 2048 blocks, each block may include 64, 128, or 192 pages based on whether the block is an SLC block, 2-bit MLC block, or 3-bit MLC block, and each page can include 512 bytes. These numbers, however, are merely illustrative and are not intended to be limiting.

User interface 130 may allow a user to interact with the host device or system of memory system 100. In some embodiments, user interface 130 can include an audio output, such as any type of speaker (e.g., computer speakers or headphones). The audio output can be used, for example, to provide music or any other audio to the user. In some embodiments, user interface 130 can include a display, such as a liquid crystal display (LCD), a touchscreen display (e.g., multi-touch panel), or any other type of display for presenting visual media or text (e.g., games or graphics such as album cover art) to the user. In some embodiments, user interface 130 can provide haptic outputs (e.g., vibrational outputs). User interface 130 can include an input device, which can take on any of a variety of forms, such as one or more of a button, keypad (e.g., computer keyboard), dial, click wheel, touch screen, or accelerometer.

Memory system 100 can include multiple ECC engines, including at least ECC engines 140 and 150. ECC engines 140 and 150 can each employ one or more error correcting or error detecting codes, such as a Reed-Solomon ("RS") code, a Bose, Chaudhuri and Hocquenghem ("BCH") code, a cyclic redundancy check ("CRC") code, or any other suitable error correcting or detecting code. ECC engines 140 and 150 may be used to protect data that is stored in non-volatile memory dies 124A-124N, and therefore the type and strength of ECC engines 140 and 150 may be selected based on the properties and reliability of NVM dies 124A-124N.

ECC engines 140 and 150 may have different strengths. In other words, ECC engine 140 may employ an error correcting code able to correct up to t errors (and detect even more than t errors), and ECC engine 150 may employ a different error correcting code able to correct more than t errors. Data protected using ECC engine 150 may therefore be more resilient to effects of error-causing phenomena (e.g., program disturb, charge loss, etc.) than data protected by using ECC engine 140. Accordingly, host processor 110 or NVM controller 122 may choose between using ECC engines 140 and 150 to achieve a desired reliability. In other embodiments, as another way to achieve different degrees of protection, host processor 110 or NVM controller 122 may be configured to apply both ECC engines 140 and 150 on some data (e.g., as an inner and outer code) and only one of ECC engines 140 and 150 on other data. It should be understood that host processor 110 or NVM controller 122 can use any suitable technique to provide different degrees of protection.

ECC engines 140 and 150 may be implemented using any suitable software-based or hardware-based approach. For example, in some embodiments, ECC engines 140 and 150 may be software modules executed by host processor 110 or by NVM controller 122. In other embodiments, ECC engines 140 and 150 may be implemented using hardware (e.g., an ASIC), such as using one or more linear feedback shift registers ("LFSRs"). The ECC hardware may be included in NVM package 120 for access and use by NVM controller 122. Alternatively, the ECC hardware may be included with and accessed by host processor 110. In these latter embodiments, ECC engines 140 and 150 may be included on the same substrate as host processor 110 (e.g., on a system-on-a-chip ("SOC")). While memory system 100 is illustrated as having two ECC engines, it should be understood that memory system 100 can include any suitable number of ECC engines.

As discussed above, host processor 110 and optionally NVM controller 122 may be configured to perform memory management and access functions for NVM dies 124A-124N. This way, host processor 110 and perhaps NVM controller 122 can manage the memory locations (e.g., super blocks, pages, blocks, and planes) of NVM dies 124A-124N and the information stored therein. The memory management and access functions may include issuing read, write, or erase instructions and performing wear leveling, bad block management, garbage collection, logical-to-physical address mapping, SLC or MLC programming decisions, applying error correction or detection using ECC engines 140 and 150, and data queuing to set up program operations. As described in greater detail, the memory management and access functions can further include determining the priority of data being stored in or retrieved from NVM dies 124A-124N and accessing the data based on the determined priority.

For raw NVM implementations, all or substantially all of the above-listed and other memory management/access functions may be performed by host processor 110 (e.g., via NVM driver 112), and ECC engines 140 and 150 may be accessed by host processor 110. For managed NVM implementations, the above-listed and other functions may be allocated between host processor 110 and NVM controller 122 in any suitable manner. For example, in some embodiments, NVM microcontroller 122 may perform error correction/detection using ECC engines 140 and 150 and data queuing for NVM dies 124A-124N, while most or all of the other memory management and access functions may be allocated to host processor 110.

In some embodiments, host processor 110 or NVM controller 122 may be configured to partition data being stored in the NVM dies 124A-124N. In some embodiments, the data may be partitioned based on a priority assigned to the data. For example, for two-partition implementations, the data may be classified as having a higher priority (referred to herein sometimes as "high priority" data) or having a lower priority (referred to herein sometimes as "standard priority" data). The terms "high" and "standard" are used only for clarity in distinguishing between data to be more strongly protected from data to be less strongly protected (as described in detail below), and is not intended to suggest any additional properties about the data. The data may be partitioned into any suitable number of partitions, but for simplicity and not of limitation, various embodiments disclosed herein may be described as using high and standard priority partitions.

Host processor 110 or NVM controller 122 may assign the priority of data based on any number or combination of factors. In some embodiments, the priority may be assigned based on the recoverability of the data. The "recoverability" may indicate the ease in which an electronic system can reconstruct or re-obtain the data and/or the amount of information needed from a user to reconstruct or re-obtain the data. For example, any media or other data (e.g., music, videos, pictures, electronic files, e-mails, text messages, word processing documents, etc.) that has not been synced or backed up elsewhere may be classified as high priority, while data that has been backed up may be classified as standard priority. As another example, user-generated or user-personalized data, such as user preferences or user-created documents, may be more difficult to recover or reconstruct than certain non-critical software modules, which can be downloaded from a server. Therefore, personalized data may be assigned a higher priority than recoverable software modules, such as the software modules used to generate or obtain the personalized data.

In some embodiments, host processor 110 or NVM controller 122 may assign the priority of data based on user indications specifying how important the data is to the user. An example of such user indications will be described below in connection with FIG. 3. In some embodiments, host processor 110 may classify user data's priority based on the type of data that is being stored. For example, data that is critical to the operation of the host device or system may be assigned a higher priority, while other non-critical data may be assigned a lower priority. Critical data can include, for example, boot data used during bootup of the host device or system and/or metadata needed to manage the storage of data (e.g., index mapping physical to logical addresses, etc.).

Host processor 110 or NVM controller 122 may partition the data for storage using approaches referred to herein as "physical" partitioning, "logical" partitioning, or a combination of physical and logical partitioning. "Physical" partitioning may refer to partitioning physical addresses, and therefore to partitioning memory locations (e.g., pages, blocks, super blocks, or dies of NVM dies 124A-124N) of a non-volatile memory. For example, host processor 110 or NVM controller 122 may implement physical partitioning by allocating certain memory locations for storing high priority data and other memory locations for storing standard priority data.

"Logical" partitioning may refer to any partitioning schemes that do not involve dividing up physical locations of a non-volatile memory. For example, to implement logical partitioning, host processor 110 or NVM controller 122 may partition an address space that does not directly map to the physical address space of NVM dies 124A-124N, such as partitioning the logical address space used by a file system (described below). Alternatively or in addition, host processor 110 or NVM controller 122 may implement logical partitioning by processing high priority data differently from standard priority data prior to determining where to store the processed data. For example, host processor 110 or NVM controller 122 may encode high priority data using a higher-strength error correcting code (e.g., using ECC engine 150) and may encode standard priority data using a lower-strength error correcting code (e.g., using ECC engine 140).

As described above, memory management and access functions may be performed by host processor 110 and/or by NVM controller 122. However, for simplicity and not of limitation, various such features and functionalities may be described herein as being included in or performed entirely by host processor 110 (e.g., via NVM driver 112). It should be understood that any of these NVM functions may be performed instead by NVM controller 122 in managed NVM package implementations. For example, any of the features discussed below in connection with NVM driver 230 may be performed by a NVM controller.

Figure 2:
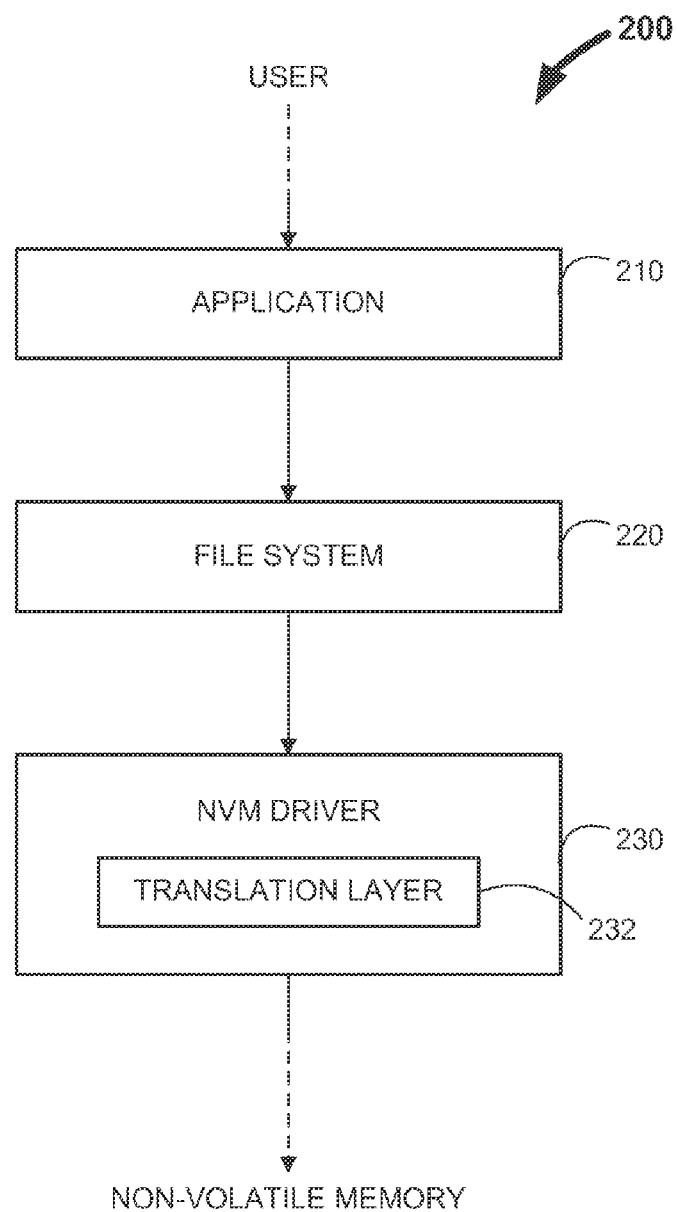
FIG. 2 is graphical view of layered modules that may be executed by a host processor or by a host processor and NVM controller in accordance with various embodiments of the invention.

Turning now to FIG. 2, a graphical view of layered modules 200 that may be executed by host processor 110 is shown, and therefore FIG. 2 will be described with continued reference to FIG. 1. Layered modules 200 can include application 210, file system 220, and non-volatile memory driver 230, the last which can have any of the features and functionalities described above in connection with non-volatile memory driver 112 of FIG. 1 (and vice versa). Modules 200 may layered such that the top-most modules (i.e., application 210) may be higher-level modules that may interact more closely with the user of memory system 100 (FIG. 1), while the bottom-most modules (e.g., NVM driver 230) may be lower-level modules that may interact more closely with system components (e.g., non-volatile memory package 120 (FIG. 1)). The components of layered modules 200 may operate such that data can be partitioned and stored in a non-volatile memory, such as in non-volatile memory package 120. As will become apparent below, any of the components may be configured to assign a priority to the data so that modules 200 can logically or physically partition the data based on the assigned priority.

Application 210 can include any suitable program that may interface with a user of the host system or device of memory system 100. During execution, application 210 may be configured to write data to or read data from a non-volatile memory, although the specifics of how the data is stored or retrieved may be handled by lower-level modules. Such data that may be obtained or generated by an application or another higher-level module may be referred to sometimes as "user data." Based on interactions with the user (e.g., user selections or user responses to prompts, etc.) or on current operating conditions or scenarios, application 210 may determine the priority of user data to be stored. For example, application 210 may assign the user data as high priority or standard priority based on any one or any combination of the factors discussed above.

FIG. 3A may illustrate one scenario in which application 310 may allow a user to indicate the priority of user data. In particular, FIG. 3A shows playlist display screen 300. Playlist display screen 300 may be provided via user interface 130 of FIG. 1 by application 210 of FIG. 2, and therefore FIG. 3A will be described with continued reference to FIGS. 1 and 2. Display screen 300 may present a playlist of music to a user. The audio elements (e.g., songs) in the playlist may be listed in cells, such as cells 306 and 308. For example, cell 306 can include any suitable information about the first audio element in the playlist (i.e., Song A), such as the name of the song, the name of the associated album, and the name of the artist.

Application 210 may enable a user to specify the priority of songs in the playlist using any suitable technique. For example, in one embodiment, each cell in playlist display screen 300 may include a "My Rating" area 302 in which the user can indicate how much the user likes a particular song by, for example, selecting a number of stars out of five possible stars. This approach may be advantageous, as the user can provide an indication of the desired priority of a song indirectly—i.e., without having application 310 prompt the user for this information or using a field specifically dedicated for obtaining this information. For the example illustrated in FIG. 3A, Song A listed in cell 306 may have been given a five-star rating by the user, and application 210 may interpret this rating as assigning Song A a high priority. This is contrast to Song B listed in cell 306, which may be assigned standard priority due to its low one-star rating.

In some embodiments, application 210 may provide include a "Priority" area 304 in each of the cells in playlist display screen 300. From "Priority" area 304, a user may expressly or directly select whether to classify the song as high priority or standard priority.

Application 210 may provide a user with the ability to directly or indirectly specify a priority for a variety of different types of data, such as other forms of media (e.g., videos and pictures) or other electronic files. Application 210 may obtain priority information from the user using any suitable approach. For example, application 210 may be an e-mail application that can provide a list of incoming e-mail messages (i.e., an inbox). In these embodiments, application 210 may enable a user to indirectly indicate a desired priority by moving e-mail messages to specific folders or by queuing e-mail messages for deletion. Application 210 may, for example, assign e-mail messages queued for deletion a lower priority than other e-mail messages, since the user has indicated that the e-mail messages will likely be purged from the system without further viewing. Alternatively, application 210 may assign user-generated data as high priority and non-user-generated data as standard priority. Such user-generated data can include, for example, any media (e.g., videos or pictures) captured by the user, e-mail drafts, and game states or other application states.

Figure 3B:
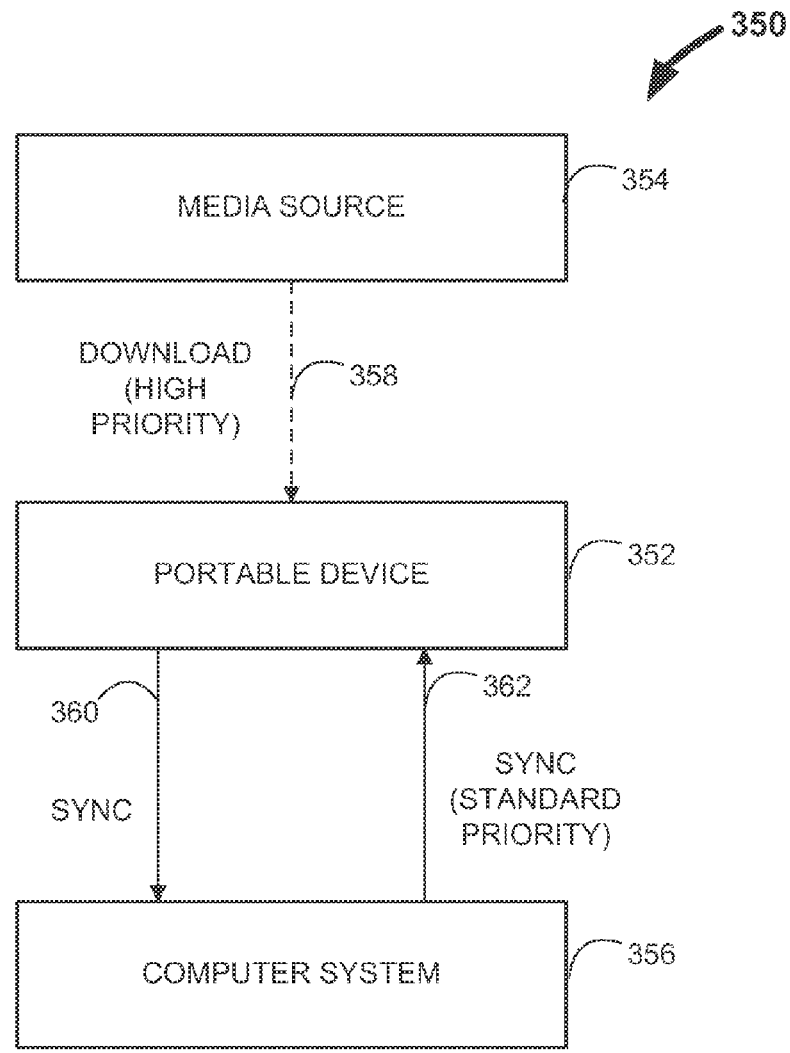
FIG. 3B is an illustrative system including a portable device in accordance with various embodiments of the invention.

Referring now to FIG. 3B, system 350 is shown that may illustrate another way in which application 210 can assign the priority of data. System 350 can include portable device 352, which may represent some or all of the components of memory system 100 and may execute application 210. System 350 can further include media source 354 and computer system 356 that may each communicate and exchange files (e.g., media files, such as music, videos, etc.) with portable device 352. Portable device 352 and computer system 356 may represent two electronic devices or systems owned or operated by the same user, such as a portable media player and a desktop or laptop computer. Media source 354 may include any other content source from which portable device 352 may download media or other files via, for example, wireless connection 358. For example, media source 354 may include an online media store or other media server.

Portable device 352 may store files obtained from both media source 354 and computer system 356 and, via application 210, may assign a priority to the files based on where the files are received from. For example, any media or other file types received at portable device 352 from media source 354 may initially be assigned a high priority by application 210, since these files may not yet be backed up to computer system 356. That is, because the files may be received for storage on only one of the user's device (i.e., on portable device 352 but not computer system 356), assigning the files a higher priority can provide higher data retention and reliability for the files.

Files synched with computer system 356, on the other hand, may be assigned a lower priority by application 210. Such synchronization operations may involve both copying files from portable device 352 to computer system 356 (as illustrated by path 360) and copying files from computer system 356 to portable device 352 (as illustrated by path 362). Any files copied to computer system 356 may be or include files originally received from media source 354, and may therefore be initially assigned a high priority. The synchronization process can involve portable device 352 reassigning these files from a high priority to a standard priority, since these files may no longer be stored on only one of the user's devices. Similarly, for files copied from computer system 356 to portable device 352, application 210 may assign the files a standard priority, because these files are already stored on computer system 356 (i.e., another of the user's devices) and can be re-copied if a storage error on portable device 352 occurs.

Returning to FIG. 2, application 210 may be configured to request that user data (e.g., e-mail messages, media received from media source 354 or computer system 356, etc.) be stored in or retrieved from a non-volatile memory, such as in non-volatile memory package 120 of FIG. 1. Application 210 may provide such a request to file system 220, which may manage the file and folder structure for an operating system running on host processor 110 (FIG. 1). With the request, application 210 may provide the user data to file system 210 along with a determined priority (if necessary). In some embodiments, file system 220 may by default assign the user data a priority (e.g., high priority) unless application 210 expressly provides an indication otherwise, such as via an input/output control ("ioctl") command or another suitable type of flag. In other embodiments, such as when user-generated data is assigned as high priority, application 210 may specify a special directory location or open a special file to indicate that the data is user-generated and should be stored as high priority data.

File system 210 may operate in a logical address space that spans from logical address 0 (e.g., logical block address ("LBA") 0) through logical address n, where n is the largest logical address used by file system 210. Responsive to a request from application 210 to store user data, file system 210 can identify a logical address within the logical address space at which to store the user data. In some embodiments, to distinguish between high priority data and standard priority data, file system 210 can identify a logical address within a first predetermined range for high priority data and within a second predetermined range for standard priority. For example, file system 210 can identify a logical address between address 0 and address X for high priority data and between address X+1 and address n for standard priority data, where X may be any suitable number between 0 and n. This way, file system 210 can logically partition the data into a "high priority partition" and a "standard priority partition" and may indicate the priority of user data to NVM driver 220 without needing an extra flag or control signal.

In some embodiments, file system 220 may include multiple file systems to handle the different priorities of user data. For example, file system 220 can include a first file system associated with high priority data and a second file system associated with standard priority data. File system 220 can include multiple separate file systems by implementing a union file system. A union file system may refer to a construct with multiple file systems, but where the files associated with each file system may be virtually combined so that the files appear to an application (e.g., application 210) as being associated with a single file system. This way, the interface between application 210 and file system 220 may remain unchanged even though file system 220 may include multiple separate file systems.

Figure 4:
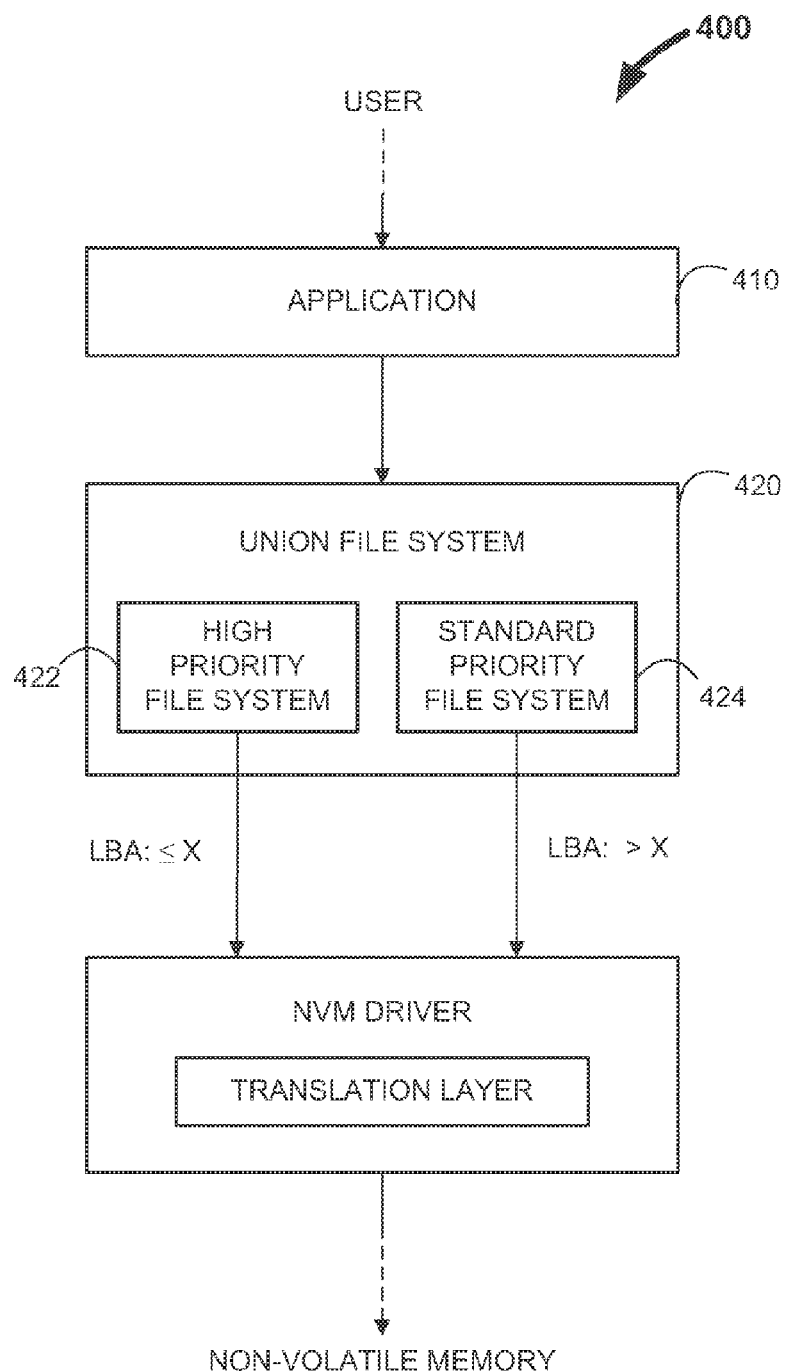
FIG. 4 is graphical view of layered modules including a union file system that may be executed by a host processor or by a host processor and NVM controller in accordance with various embodiments of the invention.

FIG. 4 is a graphical view of layered modules 400, which may be a more detailed view of some embodiments of layered modules 200 (FIG. 2) in which the file system may be a union file system 420. Thus, layered modules 400 may have any of the features and functionalities of layered modules 200, and vice versa. Union file system 420 can include two separate file systems 422 and 424. High priority data may be provided to file system 422, which may be configured to identify a logical address for the data within the high priority partition (e.g., LBAs less than or equal to X). Standard priority data may be provided to file system 422, which may be configured to identify a logical address for the data within the standard priority partition (e.g., LBAs greater than X). This way, file systems 422 and 424 may each operate using a subset of the entire logical address space available to union file system 420.

In some embodiments, union file system 420 may assign data (e.g., user data) a high priority by default. This approach may be used when, for example, application 410 is not configured to specify a priority or when application 410 provides no priority information to union file system 420 unless standard priority is expressly requested. In these embodiments, union file system 420 may direct write requests from application 410 to high priority file system 422 for handling. When the priority of the user data is lowered (e.g., when the user backs up the user data elsewhere or queues an e-mail message for deletion, etc.), union file system 422 may re-allocate control of the user data from high priority file system 422 to standard priority file system 424. For example, union file system 420 may direct high priority file system 424 to read the user data using its originally-assigned logical address and may direct standard priority file system 424 to re-write the user data using a newly assigned logical address. Because write requests from application 410 may initially be directed to high priority file system 422, high priority file system 422 may sometimes be referred to as the "read/write" or "R/W" file system of union file system 420, and standard priority file system 424 may sometimes be referred to as the "read only" or "RO" file system of union file system 440.

Returning to FIG. 2, file system 220 (which may be a union file system such as union file system 420 of FIG. 2) may provide access requests to NVM driver 230, such as read or write requests. The access requests can include the logical address identified by file system 220. NVM driver 230 can include translation layer 232, such as a flash translation layer ("FTL"). Translation layer 432 can perform any suitable technology-specific or vendor-specific functions for a non-volatile memory, such as any functions typical of a flash translation layer. For example, translation layer 432 can perform wear leveling, garbage collection, and can handle the access requests from file system 220 (e.g., by processing any data provided for storage or generating any necessary metadata used to manage storage of the data).

NVM driver 230 can determine or assign the priority of data to be stored. In some embodiments, the priority may have been assigned by a higher-level module, and NVM driver 230 may determine the pre-assigned priority based on an associated logical address, for example. In other embodiments, NVM driver 230 may assign the priority of data to be stored. For example, NVM driver 230 may assign a priority based on which module (e.g., file system 220) that the data was received from. As another example, NVM driver 230 may assign a priority based on whether the data is user data received from file system 220 or metadata generated by NVM driver 230 (e.g., an index table mapping logical addresses to physical addresses, etc.). In these latter embodiments, NVM driver 230 may assign metadata a high priority and user data a standard priority. Alternatively, NVM driver 230 can assign metadata a high priority and user data a priority based on its logical address.

In some embodiments, NVM driver 230 may process and store data (e.g., user data) based on priority. NVM driver 230 may select an error correcting code to apply to the data based on the data's priority. For example, NVM driver 230 may employ ECC engine 150 (FIG. 1) on the data responsive to determining that the data has high priority and may employ ECC engine 140 (FIG. 1) responsive to determining that the data has standard priority. Because ECC engine 150 may have a higher correcting capability than ECC engine 140, NVM driver 230 may protect higher priority data more than lower priority data.

To store the encoded data in a non-volatile memory, NVM driver 230 (e.g., via translation layer 232) can map a logical address received from file system 220 to a physical address. The physical address may correspond to a memory location of the non-volatile memory (e.g., page, block, super block, and/or plane, etc.) that may be accessed to fulfill the access request. In some embodiments, NVM driver 230 may select any available memory location (e.g., erased block) for storing data to fulfill a write request regardless of the priority assigned to the data. That is, while the range of usable logical addresses for a piece of data may be restricted by file system 220 based on the priority of the data, NVM driver 230 may not apply any such limitations based on priority. Thus, in some operating scenarios employing such logical partitioning techniques, a non-volatile memory may have blocks storing data encoded using a first ECC interspersed with blocks storing data encoded using a second ECC.

In other embodiments, memory system 100 (FIG. 1) may employ physical data partitioning instead of or in addition to logical data partitioning. In these embodiments, NVM driver 230 may allocate physical addresses to data being stored based on the priority of the data. For example, NVM driver 230 may identify a physical address within a first predetermined range when the data is assigned a high priority and may identify a physical address within a second predetermined range when the data is assigned a standard priority.

Responsive to a write request, NVM driver 230 may direct a non-volatile memory (e.g., NVM package 120 of FIG. 1, such as via NVM controller 122) to program processed data (e.g., encoded data) into the memory location specified by the identified physical address. NVM driver 230 may also store an identifier in the non-volatile memory with the processed data so that NVM driver 230 can properly interpret the processed data on a subsequent read operation. For example, if any given memory location may include data encoded using either a first ECC or a second ECC, it may initially be unclear whether to decode the stored data using the first ECC or the second ECC. Thus, in some embodiments, the identifier stored with the data can indicate the priority of the data, and therefore which ECC to use when decoding the data.

In some embodiments, the identifier may be a codeword in the codeword space of a default ECC, such as in the codeword space of the highest strength ECC used by the memory system (e.g., employed by ECC engine 150). That is, even if the data being identified uses a lower-strength ECC, the identifier may still be a codeword associated with the default, higher-strength ECC. This way, because NVM driver 230 can use the same ECC to decode each identifier (thereby correcting any errors contained therein), NVM driver 230 does not initially need any ECC information when reading the non-volatile memory.

NVM driver 230 can store an identifier at any suitable memory location relative to the memory location in which associated data is stored. In some embodiments, NVM driver 230 may store one or more identifiers in a portion of a block to indicate which ECC was applied to the data stored in the remaining portions of the block. For example, one or more identifiers can be stored in the first page or set of pages in a block, such as in the first one, two, three, four, or five pages of 64 total pages. This way, responsive to a read request, NVM driver 230 can read the first page (or the second or subsequent page if too many errors are present in the first page) to determine which ECC was applied to the pages in the block storing data. NVM driver 230 may then read the data from the appropriate memory location in the block, and NVM driver 230 can decode the data using the ECC identified by the identifier.

While identifiers have been described above as being used to specify an ECC, it should be understood that identifiers can be used to indicate other features or processing techniques applied to stored data, such as any other formatting or usage applied to the stored data.

Figure 5:
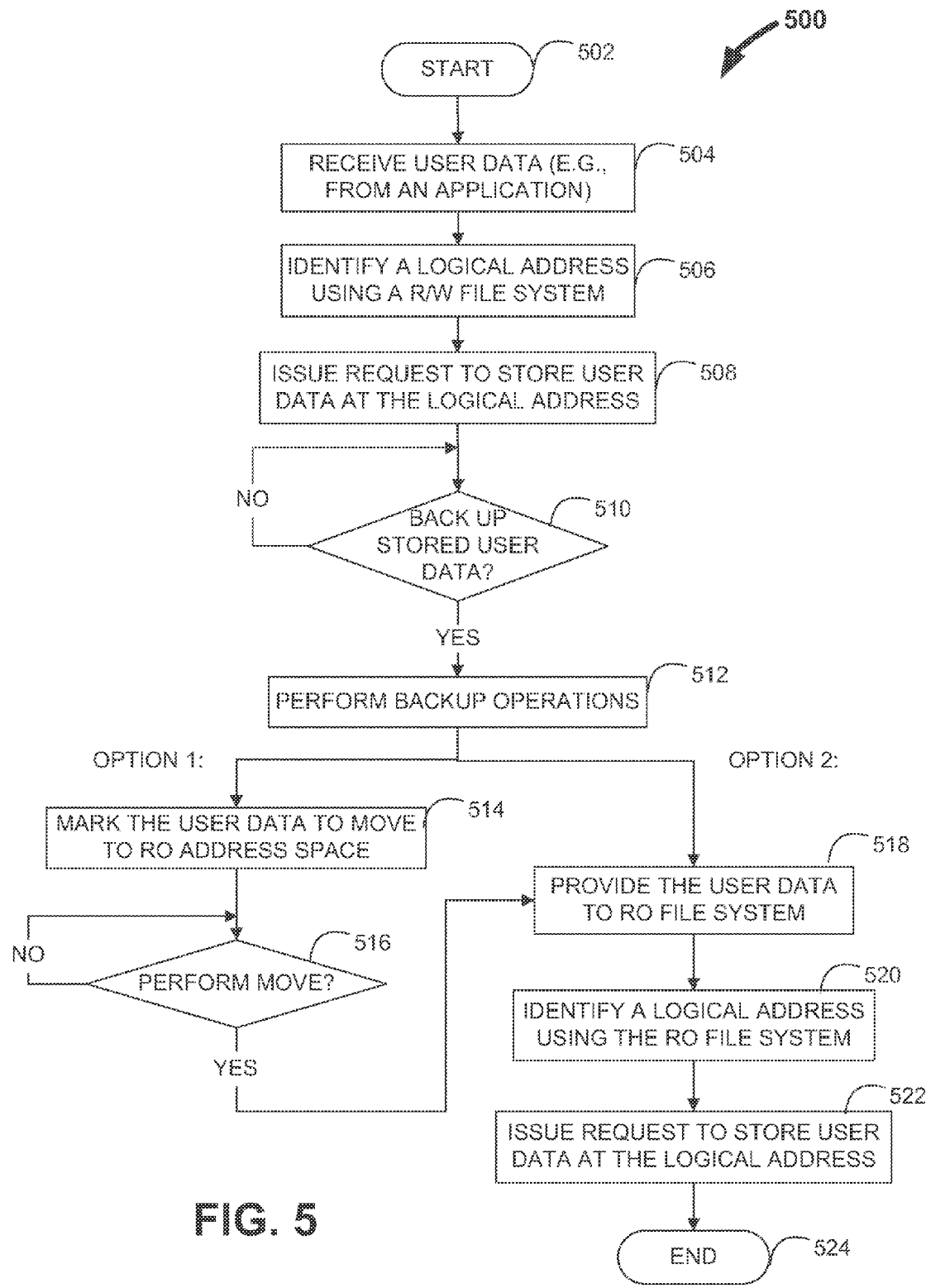
FIG. 5 is a flowchart of an illustrative process for partitioning user data for storage in a non-volatile memory in accordance with various embodiments of the invention.
Figure 6:
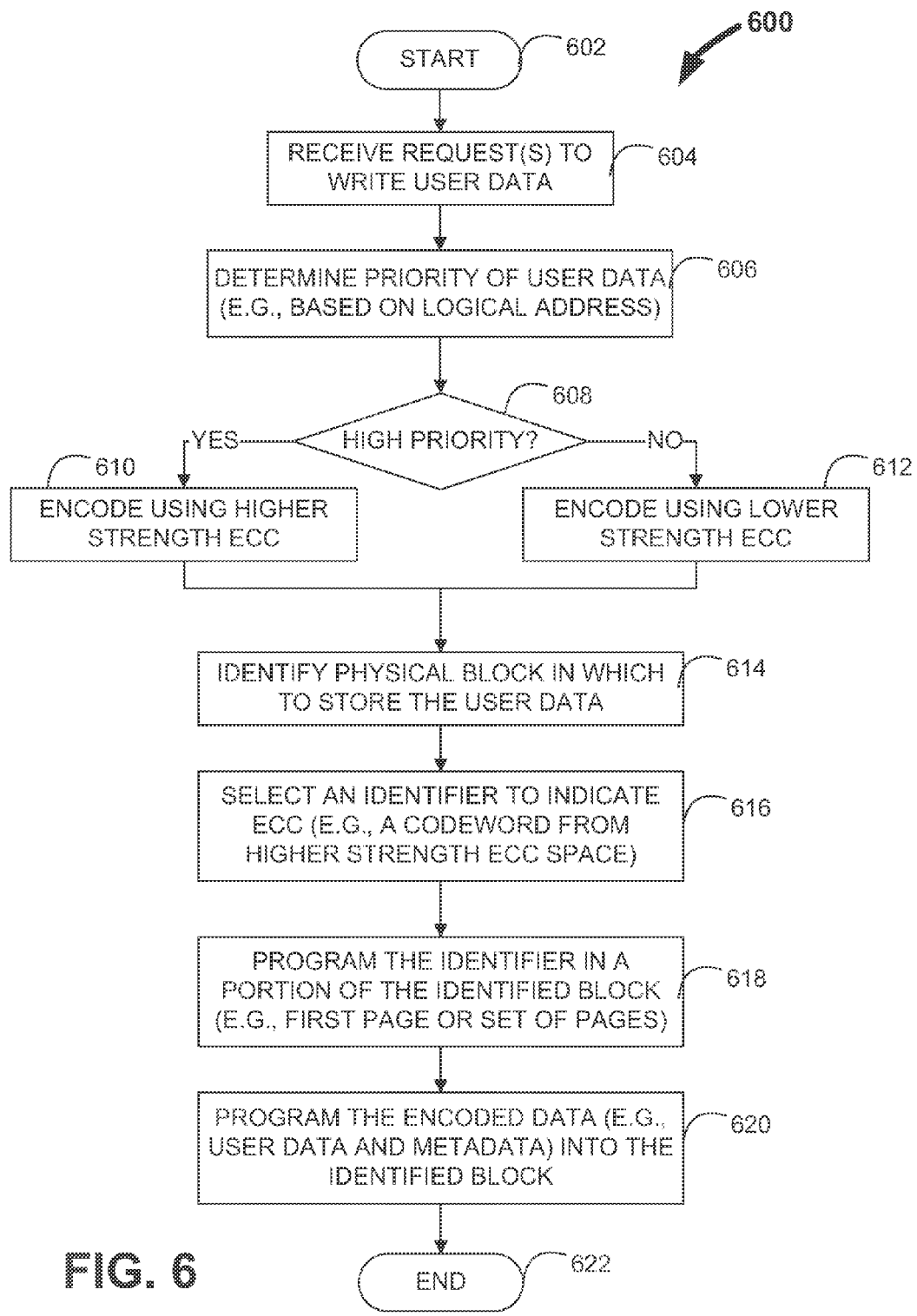
FIG. 6 is a flowchart of an illustrative process for storing user data in a non-volatile memory based on the user data's priority in accordance with various embodiments of the invention.
Figure 7:
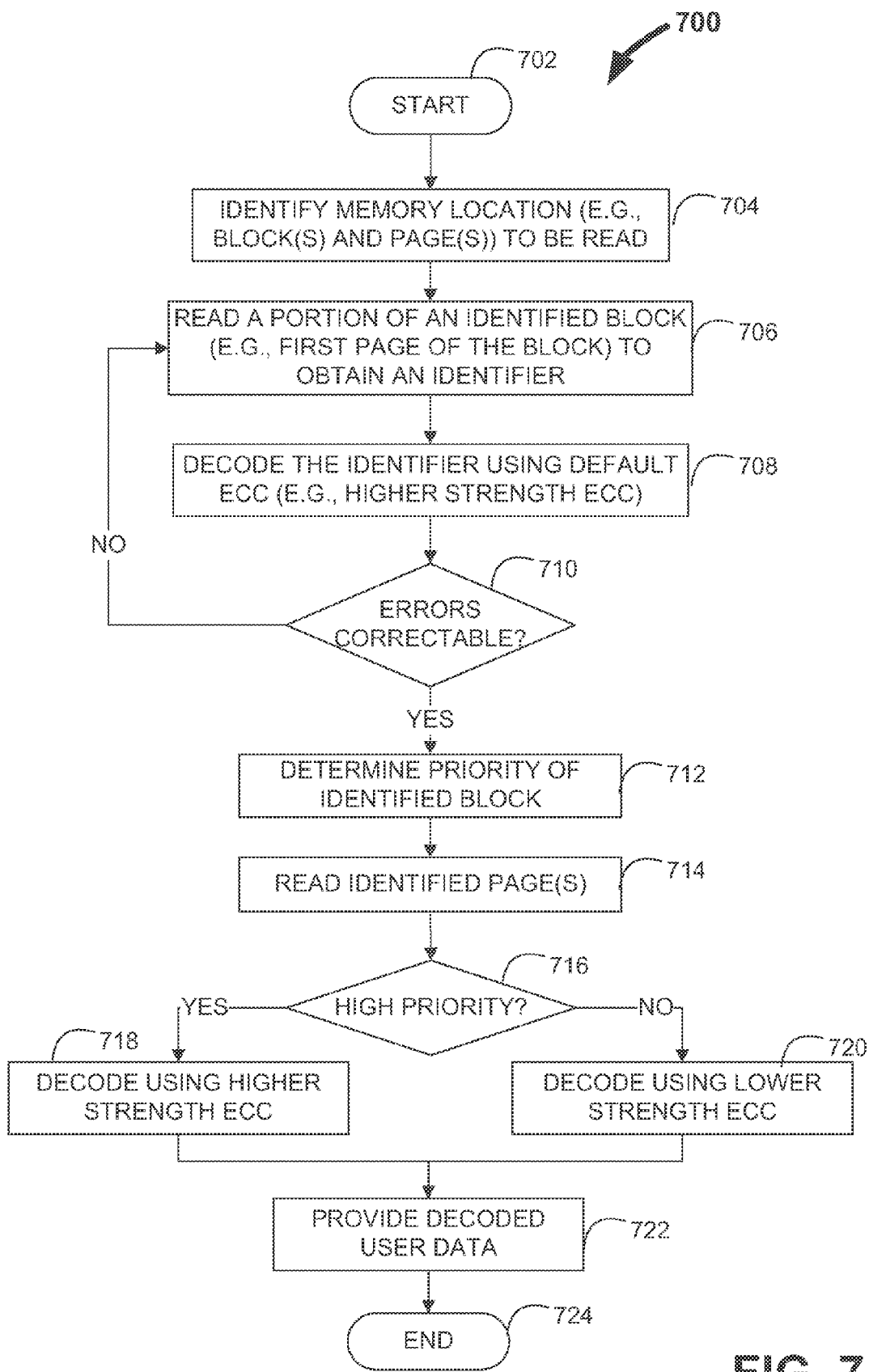
FIG. 7 is a flowchart of an illustrative process for reading user data from a non-volatile memory based on the user data's priority in accordance with various embodiments of the invention.

Referring now to FIGS. 5-7, flowcharts of illustrative processes are shown in accordance with various embodiments of the invention. These processes may be executed by one or more components in a memory system (e.g., memory system 100 of FIG. 1) to manage the information stored in a non-volatile memory (e.g., NVM dies 124A-124N of FIG. 1), such as NAND flash memory. It should be understood that these processes are merely illustrative. Any of the steps may be removed, modified, or combined, and any additional steps may be added, without departing from the scope of the invention. For example, the processes may be described in terms of handing storage of user data, although it should be understood that the processes may be used instead to handle storage of any other types of data (e.g., boot data, metadata generated by a non-volatile memory driver, etc.).

Turning first to FIG. 5, a flowchart of process 500 is shown for partitioning user data for storage in a non-volatile memory. The user data may be partitioned based on the priority of the user data. In some embodiments, the steps of process 500 may be performed by a file system, and in particular a union file system as described above in connection with FIG. 4.

Process 500 may begin at step 502. At step 504, user data may be received for storage in the non-volatile memory, such as from an application. The user data may be received as part of a write request from the application. At step 506, a logical address may be identified using a read/write file system of a union file system. The read/write file system may be able to select any suitable unused logical address from within a subset of all logical addresses available for use by the union file system, such as within a predetermined range of the logical addresses allocated to a high priority partition.

Then, at step 508, a request may be issued to store the user data at the identified logical address. The request may be made to a non-volatile memory driver, which can carry out any appropriate operations to access the non-volatile memory. One example of how a NVM driver may carry out a write request will be described below in connection with FIG. 6. In other embodiments, instead of automatically providing the user data to the read/write file system, the user data may be selectively provided to the read/write file system or a read only file system based on whether the application specified the data to be high or standard priority (e.g., via an iotcl or other flag).

After step 508, in some scenarios, the user data may be stored in the non-volatile memory of the memory system, but may not yet be backed up or synced to a second source. This may occur, for example, when a user of a portable electronic device downloads media (e.g., music, videos, etc.) from a server using an over-the-air connection but has yet to sync the downloads to a desktop computer. Because the user data may not be backed up, the user data can be assigned a high priority and stored in the high priority partition, as discussed above in connection with step 506. At step 510, a determination can be made as to whether backup of the user data has been requested. The determination can involve determining whether the application has started a syncing process with a desktop computer, for example. Once a back up process has been initiated, process 500 can continue to step 512.

At step 512, any operations necessary to back up the user data to another source may be performed. For example, a union file system (e.g., via its read/write file system) may perform any necessary read operations in order to provide an application with the user data to back up elsewhere. The file system may, in some embodiments, be notified by a sync agent that a back up operation is in process. Once the user data has been backed up, the priority assigned to the user data may be lowered to standard priority and stored as such (e.g., using a read only file system to store the user data in a standard priority partition). The priority may be lowered by the file system or by the device's sync agent. FIG. 5 illustrates two options for moving the user data stored in the high priority partition to the standard priority partition.

As a first option, instead of immediately moving the user data once its priority is lowered, the user data may be marked for movement to the standard priority partition at step 514 (i.e., to a read only address space of the union file system). Then, at step 516, a determination may be made as to whether to begin moving the user data to the standard priority partition. This determination may be based on any suitable criteria, such as based on whether the amount of space in the high priority partition has dropped to below a predetermined threshold. Thus, the user data may not be moved until a particular condition is detected. The user data may not be moved until it becomes necessary to do so or until processing resources are sufficiently free to perform the moving. This can be advantageous in some scenarios to prevent the file system from disturbing or delaying other activities or from having to perform excessive non-volatile memory access operations.

Once the user data is ready to be moved, as determined at step 516, process 500 can continue to step 518. At step 518, the user data may be provided from the read/write file system to the read only file system of the union file system. Thus, the user data may be provided from the file system responsible for storing high priority data to the file system responsible for storing standard priority data. At step 520, a new logical address may be identified using the read only file system. The new logical address may be within the address space assigned to the standard priority partition, which may be a subset of the entire address space available to the union file system. Then, at step 522, a request to store the user data at the new logical address may be issued, such as to a non-volatile memory driver. Process 500 may then move to step 524 and end.

Returning to step 512, in some embodiments, instead of continuing from step 512 to step 514, process 500 can move to step 518 as a second option. In these embodiments, the union file system may not mark the user data to be moved at some later time, and may instead begin moving the user data to the standard priority partition.

User data stored according to the steps of process 500 may be read from the non-volatile memory at any suitable time, such as in response to a read request from an application. In response to such a request, a union file system may determine whether the user data was previously stored using the read/write file system or read only file system (e.g., by examining the logical address associated with the user data). The union file system may then direct the appropriate file system to initiate the read request with a NVM driver, for example.

Turning now to FIG. 6, a flowchart of illustrative process 600 is shown for storing user data in a non-volatile memory based on the user data's priority. In some embodiments, some or all of the steps in process 600 may represent instructions of a memory driver executed by a host processor (e.g., NVM driver 112 (FIG. 1)), or instructions executed by a NVM controller implemented in a NVM package (e.g., NVM controller 122 (FIG. 1)).

Process 600 may begin at step 602. At step 604, one or more requests to write user data may be received. In some embodiments, the write request may be received from a file system executing the steps of process 500 of FIG. 5. Then, at step 606, the priority of the user data may be determined. For example, a NVM driver may examine the logical address received with the user data to determine whether the logical address falls within a first predetermined range or a second predetermined range (e.g., by comparing the logical address to some value between the first and second ranges). If, at step 608, the user data is determined to be high priority data, process 600 may continue to step 610. At step 610, the user data may be encoded using a higher-strength error correcting code, such as by employing ECC engine 150 (FIG. 1) instead of ECC engine 140 (FIG. 1).

If, at step 608, the user data is determined instead to be standard priority data, process 600 may move to step 612 and the user data may be encoded using a lower-strength error correcting code. For example, the NVM driver may encode the user data using ECC engine 140 (FIG. 1) instead of ECC engine 150 (FIG. 1). Thus, the amount of protection against error-causing phenomena applied to the user data may be based on its priority. In addition to or instead of changing the encoding scheme based on the user data's priority, any other suitable processing may be performed on the user data based on priority.

Continuing to step 614, a physical block of the non-volatile memory may be identified in which to store the encoded user data. Step 614 may involve, for example, mapping a logical address received from a file system to a physical address corresponding to a physical memory location (e.g., block, page, etc.). Then, at step 616, an identifier may be selected that indicates the priority of the user data, and therefore which error correcting code was applied to the user data. For example, the NVM driver can select between two identifiers: one that is used to indicate the higher-strength ECC and one that is used to indicate the lower-strength ECC. Both identifiers may also be codewords in the same codeword space. In some embodiments, for example, both identifiers may be codewords in the codeword space of the higher-strength ECC.

At step 618, the identifier may be programmed one or more times in a portion of the block identified at step 614. In some embodiments, the identifier may be programmed into one page or a set of pages in the identified physical block (e.g., one identifier per page for multiple pages, where each identifier may be identical, redundant copies). The remaining pages of the physical portion may be used to store data (e.g., user data) that may be encoded using the error correcting code specified by the identifier. At step 620, the encoded data may be programmed into the identified physical block. Process 600 may then end at step 622.

Referring now to FIG. 7, a flowchart of illustrative process 700 is shown for reading stored user data from a non-volatile memory based on the priority of the user data. For example, process 700 may be executed to read user data stored in accordance with the steps of process 600 of FIG. 6, such as during a garbage collection, wear leveling, or read request operation. In some embodiments, some or all of the steps in process 600 may represent instructions of a NVM driver executed by a host processor (e.g., NVM driver 112 (FIG. 1)), or instructions executed by a NVM controller implemented in a NVM package (e.g., NVM controller 122 (FIG. 1)).

Process 700 may begin at step 702. Then, at step 704, a memory location to be read may be identified. The memory location may include one or more blocks and/or one or more pages within the identified blocks of the non-volatile memory. At step 706, a portion of an identified block may be read, such as a first page of the identified block. This portion may be used to store an identifier that specifies the priority of the data, which in turn indicates the strength of the error correcting code applied to the data stored in remaining portions of the identified block. In some embodiments, the portion of the identified block may be cached in main memory of the host device. Thus, reading the portion may involve reading a cached version of the portion of the identified block.

To interpret the identifier, the identifier may be decoded at step 708 to correct or detect any errors present in the identifier. The identifier may be encoded using a default error correcting code. Thus, regardless of what strength of encoding is used on the remaining data stored in the identified block, the NVM driver may apply the default ECC to the portion read at step 706.

In some operating scenarios, decoding at step 708 may reveal that there are errors present in the identifier that can be detected but not corrected. If, at step 710, it is determined that there are uncorrectable errors present in the identifier, process 700 may return to step 706 so that another portion storing the identifier (e.g., a second page) of the identified block may be read. Thus, by storing the identifier multiple times in a block, the identifier may be successfully read from the non-volatile memory even if multiple read attempts are needed. If, at step 710, it is determined that any errors present in a current identifier can be and have been corrected, process 700 may continue to step 712.

At step 712, the priority of the identified block may be determined based on the current identifier. Then, at step 714, the user data may be read from the non-volatile memory, such as from one or more pages in the identified block (i.e., from the same block that stores the current identifier). If, at step 716, the identifier indicates that the user data is high priority data, process 700 may move to step 718, and the user data may be decoded using the higher-strength ECC (e.g., by employing ECC engine 150 of FIG. 1). If, at step 716, the identifier instead indicates that the user data is standard priority data, process 700 may move to step 720, and the user data may be decoded using the lower-strength ECC (e.g., by employing ECC engine 140 of FIG. 1). Thus, after performing step 718 or 720, errors present in the user data read from the non-volatile memory may be corrected (if possible). The user data may then be provided to any module that requested it (e.g., the file system) at step 722 or used by a NVM driver for any suitable purpose (e.g., to perform garbage collection or wear leveling). Process 700 may then end at step 724.

The described embodiments of the invention are presented for the purpose of illustration and not of limitation.

What is claimed is:

1. A method of storing data in a non-volatile memory, the method comprising:
   receiving a logical address associated with the data;
   determining a priority of the data based on the received logical address; and
   storing the data in a first portion or a second portion of the non-volatile memory based on the priority.

2. The method of claim 1, further comprising receiving the data from a file system for storage in the non-volatile memory, wherein the logical address is received from file system.

3. The method of claim 1, wherein the determining comprises comparing the logical address to a predetermined value.

4. The method of claim 1, wherein the storing comprises:
selecting an error correcting code to apply to the data based on the determined priority;
encoding the data using the selected error correcting code; and
programming the encoded data into the non-volatile memory.

5. The method of claim 4, wherein the selecting comprising:
choosing a first error correcting code having a first strength when the data is determined to have a lower priority; and
choosing a second error correcting code having a second strength when the data is determined to have a higher priority, wherein the second strength is greater than the first strength.

6. The method of claim 1, further comprising:
generating metadata to manage memory locations in the non-volatile memory;
assigning a priority to the metadata; and
storing the metadata in the non-volatile memory based on the priority of the metadata.

7. The method of claim 1, wherein the first portion corresponds to memory locations associated with a first priority and the second portion corresponds to memory locations associated with a second priority.

8. The method of claim 1, wherein memory locations associated with the first portion are not located in physically contiguous areas of the non-volatile memory.

9. A memory system for storing data, the memory system comprising:
a non-volatile memory comprising a plurality of blocks; and
a processor configured to:
determine a priority of the data based on content of the data;
identify one of the blocks in the non-volatile memory in which to store the data based on the determined priority;
program at least one identifier in a first portion of the identified block, wherein the identifier indicates the determined priority; and
direct the non-volatile memory to store the data in a second portion of the identified block.

10. The memory system of claim 9, wherein the identified block comprises a sequence of pages, and wherein the at least one identifier is programmed in a first set of pages of the sequence.

11. The memory system of claim 9, wherein the at least one identifier comprises a plurality of identifiers each indicating the determined priority.

12. The memory system of claim 9, wherein the at least one identifier is selected from one of a first identifier and a second identifier, wherein the first identifier and the second identifier are each codewords of a predetermined error correcting code.

13. The memory system of claim 12, wherein the processor is further configured to:
pick a first error correcting code having a first strength for encoding the data when the data is determined to have a lower priority; and
pick a second error correcting code having a second strength for encoding the data when the data is determined to have a higher priority, wherein the second strength is greater than the first strength, and wherein the predetermined error correcting code corresponds to the second error correcting code.

14. The memory system of claim 9, wherein the non-volatile memory comprises NAND-type flash memory.

15. The memory system of claim 9, wherein the plurality of blocks are divided into a first portion and a second portion, and wherein identifying one of the blocks in the non-volatile memory in which to store the data comprises:
selecting one of the blocks in the non-volatile memory from either the first or second portion based upon the determined priority.

* * * * *